United States Patent [19]

Shinada

[11] Patent Number: 5,227,645
[45] Date of Patent: Jul. 13, 1993

[54] DC SQUID ELEMENT WITH QUASI-PLANAR-TYPE JOSEPHSON JUNCTION

[75] Inventor: Kei Shinada, Kyoto, Japan
[73] Assignee: Shimadzu Corporation, Kyoto, Japan
[21] Appl. No.: 761,158
[22] Filed: Sep. 17, 1991
[30] Foreign Application Priority Data
  Sep. 20, 1990 [JP] Japan .................. 2-253974
[51] Int. Cl.⁵ ............... H01L 39/22; H01B 12/00; G01R 33/035
[52] U.S. Cl. ............................. 257/34; 505/1; 505/846; 505/702; 257/36
[58] Field of Search ........... 357/5; 505/1, 702, 845, 505/846; 324/248; 257/34, 36

[56] References Cited

U.S. PATENT DOCUMENTS

| | | | |
|---|---|---|---|
| 4,403,189 | 9/1983 | Simmonds | 505/846 |
| 4,588,947 | 5/1986 | Ketchen | 357/5 |
| 4,801,882 | 1/1989 | Daalmans | 357/5 |
| 4,923,850 | 5/1990 | Stephan et al. | 505/846 |
| 4,996,621 | 2/1991 | Ruigrok et al. | 505/845 |
| 5,053,834 | 10/1991 | Simmonds | 357/5 |

FOREIGN PATENT DOCUMENTS 61-47676 3/1986 Japan .................. 357/5

OTHER PUBLICATIONS

Richter et al., "Superconducting Quantum Interferometers made of Thin Films", Instruments and Experimental Techniques, (USSR) vol. 17, No. 4, Pt. 2, pp. 1196-1198, Jul. Aug. 1974.
Harris et al., "Production of Weak Links in Superconducting Thin Films by Ion Implantation", IBM Technical Disclosure Bulletin, vol. 17, No. 9 Feb. 1975 pp. 27-28.

Primary Examiner—Rolf Hille
Assistant Examiner—M. Saadat
Attorney, Agent, or Firm—Armstrong, Westerman, Hattori, McLeland & Naughton

[57] ABSTRACT

In a dc SQUID element having two quasi-planar-type Josephson junction portions, as obtained by laminating a plurality of superconducting thin films on a substrate, a SQUID ring and a counter electrode on either of which quasi-planar-type Josephson junction portions are to be formed, are respectively formed at the lowermost layer and the uppermost layer, or at the uppermost layer and the lowermost layer, so that the value of critical current can be adjusted. The arrangement above-mentioned assures good flatness and film quality of a barrier layer interposed between the lower and upper electrodes of the quasi-planar-type Josephson junction portions. In a method of manufacturing the dc SQUID element having the arrangement above-mentioned, a protective film is formed on the thin film of the lowermost layer at the position where Josephson junction portions are to be formed, after which layers except for a thin film of the uppermost layer are formed, and the protective film is then removed immediately before the uppermost-layer thin film is formed, thus preventing damages to the Josephson junction forming area in the course of production of the dc SQUID element.

4 Claims, 5 Drawing Sheets (a)

DC SQUID ELEMENT WITH QUASI-PLANAR-TYPE JOSEPHSON JUNCTION

BACKGROUND OF THE INVENTION

The present invention relates to a dc SQUID to be used for measurement of a micromagnetic field such as instrumentation of biomagnetism, magnetic airborne detecting or the like.

There is known a Josephson junction of the quasi-planar type in which an upper electrode is formed on a lower electrode through a barrier layer, and the surface of the lower electrode is weak-linked to the surface of the upper electrode by a bridge.

In such a Josephson junction of the quasi-planar type, the weak-link length is determined by the thickness of the barrier layer interposed between the upper electrode and the lower electrode. Thus, the Josephson junction of the quasi-planar type is advantageous in that the weak-link length is determined by the adjustment of te film thickness of which control is relatively easy, as compared with a Josephson junction of the planar type requiring micro-machinings on the planar face.

FIG. 7 shows an example of the arrangement of a dc SQUID element having a conventional Josephson junction of the quasi-planar type with interlaminar insulation and barrier layers seen in a perspective manner. FIG. 7 (a) is a general plan view, while FIG. 7 (b) is an enlarged view of a portion B in FIG. 7 (a).

In this example, the dc SQUID has an arrangement of total four superconducting thin films in lamination in which a modulation coil 1 and an input coil 2 are formed at the lowermost layer on a substrate, and an input coil leading electrode 21 and a groundplane 3 are formed at the layer above the lowermost layer. A SQUID ring 4 is formed at the layer above the layer of the electrode 21 and the groundplane 3, and a counter electrode 5 is formed at the uppermost layer.

The SQUID ring 4 and the counter electrode 5 are weak-linked at two portions to each other, through a barrier layer (not shown) interposed therebetween, by a bridge 6 striding over the counter electrode 5 at both lateral edges thereof. Thus, two Josephson junctions 71, 72 are formed.

The arrangement above-mentioned may be produced, for example, according to steps as shown in plan views of FIGS. 8 to 11, in which the interlaminar insulation and barrier layers are not shown as seen in a perspective manner.

First, a superconducting thin film of the Nb type or the like is deposited on the substrate, which is then patterned to obtain the modulation coil 1 and the input coil 2. This state is shown in FIG. 8.

After an interlaminar insulation layer and contact holes are formed, a superconducting thin film is deposited from above. This film is patterned to form the groundplane 3 and the input coil leading electrode 1. This state is shown in FIG. 9.

An interlaminar insulation layer and contact holes are then formed, and a superconducting thin film is deposited from above. This film is patterned to form the SQUID ring 4 as shown in FIG. 10.

A barrier layer is formed on the entire surface of the SQUID ring 4 serving as the lower electrode. A superconducting thin film is then deposited on this barrier layer. This film is patterned to form the counter electrode 5 also serving as the upper electrode. This state is shown in FIG. 11.

Finally, a superconducting thin film is deposited from above and the bridge 6 having the pattern as shown in FIG. 7 is formed.

In a tunnel-type Josephson junction element or the like, it is not possible to adjust the value of critical current after the element has been formed. Accordingly, the order of preparing the respective layers above-mentioned does not particularly cause trouble. In a quasi-planar-type Josephson junction element, however, the value of critical current can be adjusted while monitoring the same by anodic oxidation or the like. To utilize such advantage, the bridge 6 is preferably formed at the last step.

In this point of view, the conventional element arrangement and manufacturing method mentioned earlier are reasonable in that the SQUID ring 4 and the counter electrode 5 respectively serving as the lower and upper electrodes for forming Josephson junction portions, are formed on the modulation coil 1 and the input coil 2, and the bridge 6 is formed at the uppermost layer.

When a number of films are laminated in the manner above-mentioned, it is inevitable that the surface flatness and quality of each of films of layers at upper positions are deteriorated more.

In the quasi-planar-type Josephson junction element, the film flatness and quality of the lower electrode (the SQUID ring 4 in the example above-mentioned) exerts a great influence upon the quality of the barrier layer which is formed above the lower electrode and which not only assures the insulation with respect to the upper electrode (the counter electrode 5 in the example above-mentioned), but also determines the weak-link length. In view of the foregoing, if such advantage of the quasi-planar-type Josephson junction element as to adjust the value of critical current is sacrificed, it may be considered rather preferable to dispose the lower electrode and the upper electrode at layers as lower as possible in the element, and in an extreme case, to dispose the Josephson junction portions at the lowermost layer.

OBJECTS AND SUMMARY OF THE INVENTION

Figure 1:
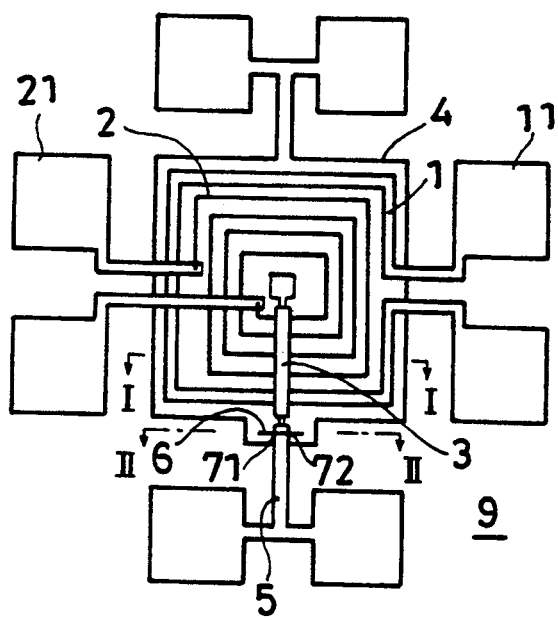
FIG. 1 shows the arrangement of a dc SQUID element in accordance with an embodiment of the present invention: in which, (a) is a plan view of the arrangement with interlaminar insulation and barrier layers seen in a perspective manner, and (b) and (c) are schematic section views taken along the lines I—I and II—II, respectively, in FIG. 1 (a)
Figure 1:
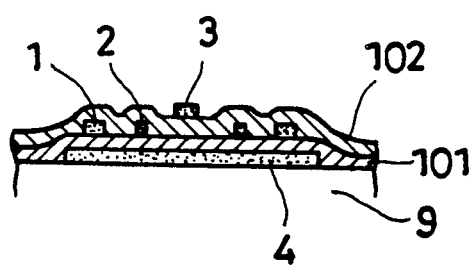
Figure 1:
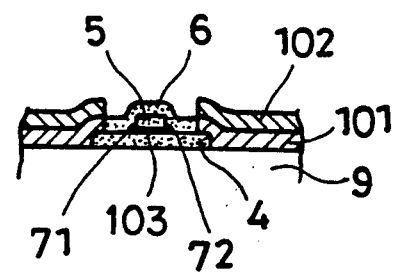

It is an object of the present invention to provide a dc SQUID element which simultaneously satisfies two contradictory requirements of a quasi-planar-type Josephson junction element, and to provide a method of manufacturing such a dc SQUID.

To achieve the object above-mentioned, the dc SQUID element in accordance with the present invention is arranged such that a SQUID ring and a counter electrode are respectively formed at the uppermost layer and the lowermost layer on a substrate, or at the lowermost layer and the uppermost layer on the substrate. A modulation coil and an input coil are formed between these two layers. The top surface of the film deposited at the lowermost layer (the SQUID ring or counter electrode) presents an area where the modulation coil, the input coil and an interlaminar insulation layer are not being formed. At this area, the uppermost-layer film (the counter electrode or SQUID ring) is deposited through a barrier layer and two quasi-planar-type Josephson junction portions are formed there by a bridge.

In the element having the arrangement above-mentioned of the present invention, the barrier layer which determines the weak-link length in the quasi-planar-type Josephson junction element, is formed on the thin film deposited on the lowermost layer of the substrate. This prevents the barrier layer from being deteriorated in film flatness and quality. Further, the bridge is formed on the thin film at the uppermost layer, thus enabling to adjust the value of critical current by anodic oxidation or the like, which is the structural advantage of the quasi-planar-type Josephson junction.

According to the present invention, the method of manufacturing the dc SQUID element having the arrangement above-mentioned comprises the steps of forming the SQUID ring or counter electrode on the substrate and covering, with a protective film, the film forming the SQUID ring or counter electrode at predetermined area thereof including and in the vicinity of the area where the Josephson junction portions are to be formed. Then, the modulation coil and the input coil are formed at a film above the lowermost layer, and the protective film is removed immediately before a superconducting thin film is deposited at the uppermost layer. The thin film at the uppermost layer is then deposited and patterned, and the bridge is formed to form two Josephson junction portions.

According to the manufacturing method above-mentioned, while that predetermined area of the thin film of the lowermost layer including a portion where the Josephson junction portions are to be formed, is covered with the protective film, the superconducting thin film for the modulation coil and the like is deposited and patterned, and the films for the interlaminar insulation layers and the like are then deposited. This prevents damages to that portion of the superconducting thin film where the Josephson junction portions are to be formed.

According to the manufacturing method of the present invention, RIE (Reactive Ion Etching) or sputtering may be suitably used for removing the modulation coil and the input coil made of a superconducting thin film of, for example, Nb formed on the protective film and for removing the interlaminar insulation layers of $SiO_2$ or the like.

The protective film should be made of a material which can resist such treatments and can be readily removed before the thin film at the uppermost layer is deposited. The protective film is preferably removed by wet-etching. In view of the foregoing, Al or MgO is suitable as the material satisfying the conditions above-mentioned.

DETAILED DESCRIPTION OF PREFERRED EMBODIMENTS

The following description will discuss a preferred embodiment of the present invention with reference to the attached drawings.

As shown in FIG. 1 (a) to (c), a SQUID ring 4 is formed on the surface of a substrate 9, i.e., at the lowermost layer. A modulation coil 1, a modulation coil leading electrode 11 and an input coil 2 are formed on the SQUID ring 4 through an insulation layer electrode 21 are formed on the modulation coil 1 and the electrode 11 through an insulation layer 102.

A barrier layer 103 is formed directly on the thin film of the lowermost layer at one end of the SQUID ring 4, and a counter electrode 5 is formed through the barrier layer 103. The surface of the counter electrode 5 and the surface of the SQUID ring are weak-linked to each other by a bridge 6 striding thereover. There are thus formed two quasi-planar-type Josephson junction portions 71, 72.

In the arrangement above-mentioned, attention should be placed on the fact that the barrier layer 3 which determines the link length of the Josephson junction portions 71, 72, is formed immediately above the SQUID ring 4 which is the lowermost film directly deposited on the substrate 9. This improves not only the flatness of the barrier layer 103 but also the film quality thereof. Further, the bridge 6 is formed at the uppermost layer of the element as done in the conventional element mentioned earlier. It is therefore possible to carry out the adjustment of the value of critical current by anodic oxidation or the like which is the advantage of the Josephson junction of the quasi-planar type.

The following description will discuss a suitable method of manufacturing the element having the arrangement above-mentioned with reference to plan views of FIGS. 2 to 6. For convenience sake, the interlaminar insulation layers 101, 102 are not shown in FIGS. 2 to 6.

Figure 2:
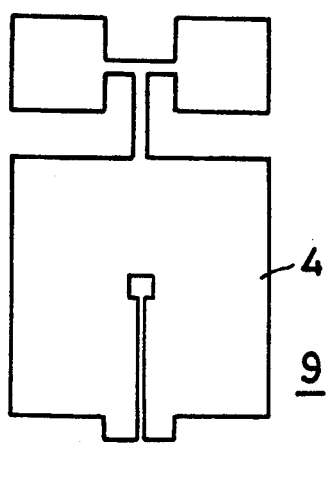
FIGS. 2 to 6 are views illustrating the steps of a method of manufacturing a dc SQUID element embodying the present invention.
Figure 3:
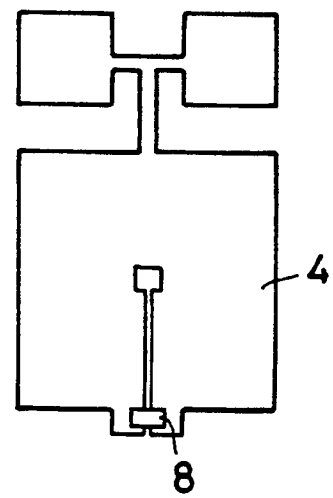

First, a superconducting thin film is deposited on the substrate 9 and the SQUID ring 4 as shown in FIG. 2 is patterned. As shown in FIG. 3, a protective Al film 8 is formed on the SQUID ring 4 at a position thereof on which the Josephson junction portions 71, 72 are to be formed.

Then, the interlaminar insulation layer 101 is deposited on the entire surface of the substrate 9 from above and necessary contact holes are formed. A superconducting thin film is deposited on the insulation layer 101 and then patterned to form the modulation coil 1, the modulation coil leading electrode 11 and the input coil 2. This state is shown in FIG. 4.

Figure 4:
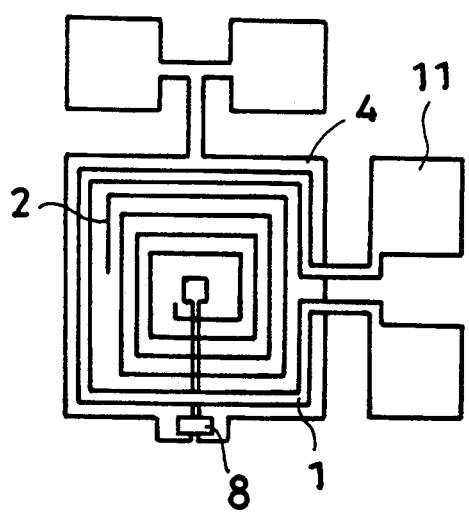
Figure 5:
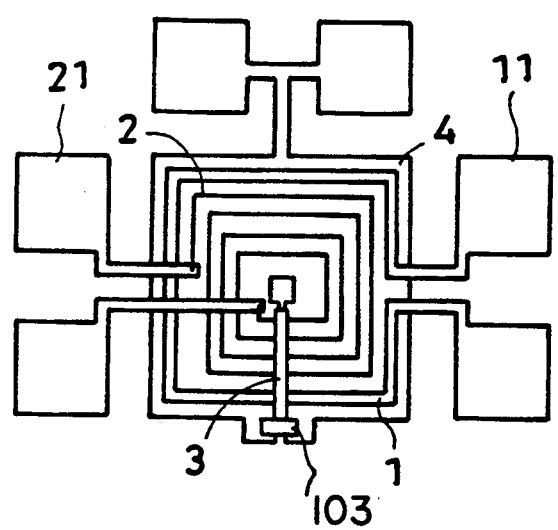

In the state shown in FIG. 4, the interlaminar insulation layer 102 is deposited on the entire surface of the modulation coil 1, the electrode 11 and the input coil 2 from above, and necessary contact holes are formed. Then, those portions of the insulation layers 101, 102 on the protective film 8, located on the positions where the Josephson junction portions are to be formed, are completely removed by RIE or sputter-etching. In the etching, the protective film 8 serves as a stopper.

Then, the protective film 8 is removed by wetetching and the barrier layer 103 is formed by oxidation or the like of the surface of that portion of the SQUID ring 4 corresponding to the protective film 8.

Figure 6:
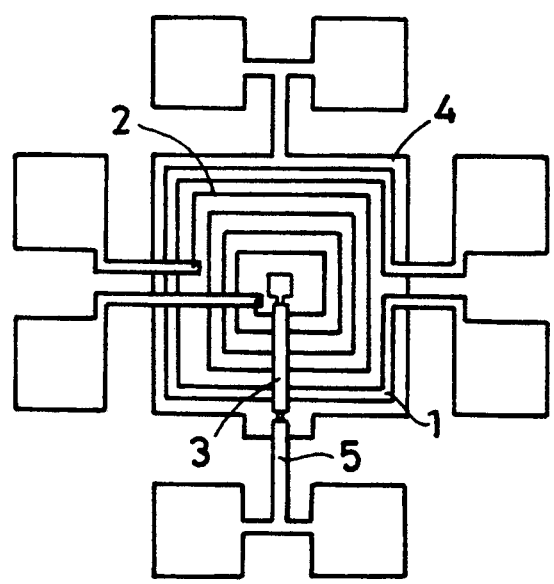
Figure 7:
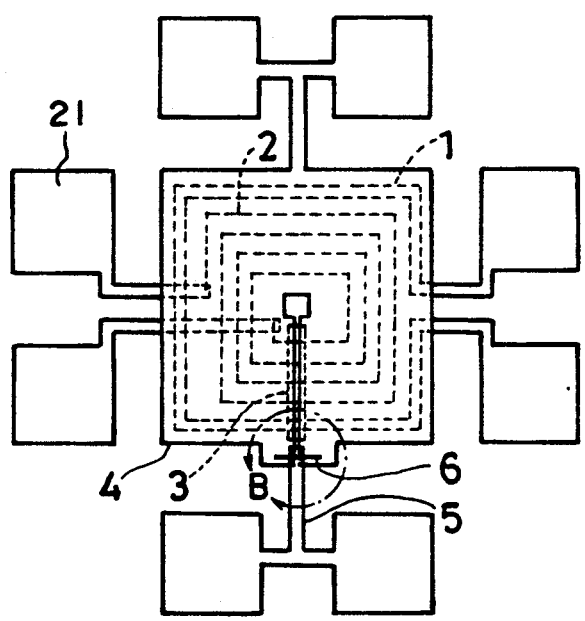
FIG. 7 shows the arrangement of a conventional dc SQUID element having Josephson junctions of the quasi-planar type: in which (a) is a plan view and (b) is an enlarged view of a portion B.
Figure 7:
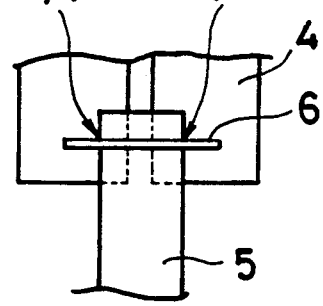
Figure 8:
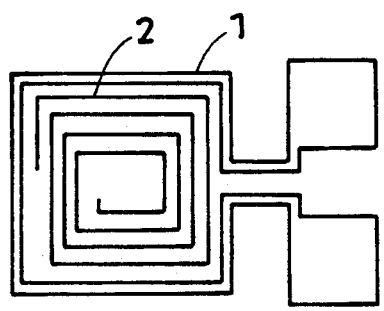
FIG. 8 to 11 are views illustrating the steps of manufacturing the conventional element having the arrangement shown in FIG. 7.
Figure 9:
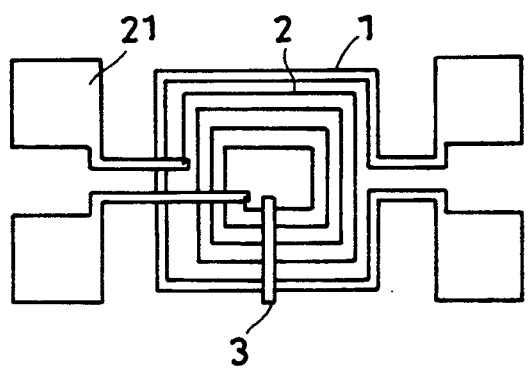
Figure 10:
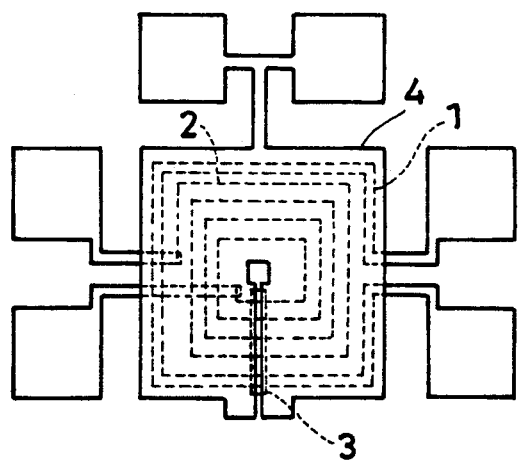
Figure 11:
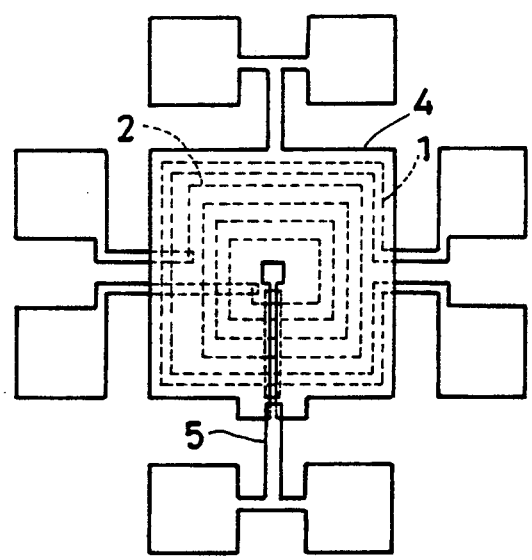

A superconducting thin film is deposited on the barrier layer 103 and patterned to form the counter electrode 5. This state is shown in FIG. 6.

In order that the SQUID ring 4 and the counter electrode 5 come in superconducting contact with the bridge 6, the entire surface of the element is sputter-etched and a superconducting thin film is then deposited in order to form the bridge 6.

A resist is then applied to the element surface. The resist is exposed to an electronic beam in a bridge pattern and then developed. With the resist film serving as a mask, the element is subjected to sputter-etching or RIE to pattern the bridge 6. There is thus obtained the dc SQUID element having the arrangement shown in FIG. 1.

In the manufacturing method above-mentioned, attention should be placed on the fact that, while that portion of the SQUID ring 4 (which is located at the lowermost layer and serves as the lower electrode) on which the Josephson junction portions are to be formed, is protected by the protective film 8, the modulation coil 1 and the input coil 2 are patterned and the interlaminar insulation layers 101, 102 or the like are removed by etching. This prevents damages to that portion of the superconducting thin film where the Josephson junction portions are to be formed.

Accordingly, the protective film 8 should be made of a material which presents a certain measure of durability with respect to RIE or sputter-etching and which can be readily removed by wet-etching before the counter electrode 5 is formed. As such a material, there may be suitably used MgO, in addition to Al mentioned earlier.

The description has been made of the embodiment in which the SQUID ring 4 is used as the lower electrode and the counter electrode 5 is used as the upper electrode. However, the present invention may be embodied as a dc SQUID element in which the counter electrode 5 is formed as the lower electrode at the lowermost layer and the SQUID ring 4 is formed as the upper electrode at the uppermost layer. Such a dc SQUID element produces the same effects as those produced by the embodiment above-mentioned. This may also apply to the steps of the manufacturing method. That is, when the alternate arrangement above-mentioned is adopted, the SQUID ring 4 and the counter electrode 5 may be mutually replaced with each other in the description in connection with the manufacturing method mentioned earlier.

It is a matter of fact that the layer including the modulation coil 1 and the input coil 2 and the layer including the groundplane 3 may be mutually replaced with each other in position.

What is claimed is:

1. A dc SQUID element comprising a SQUID ring, a counter electrode, a modulation coil and an input coil as formed by patterning respective superconducting thin films laminated on a substrate in a plurality of layers including a lowermost layer, at least one intermediate layer and an uppermost layer, said SQUID ring and said counter electrode being weak-linked at two portions thereof to each other by a bridge through a barrier layer to form two Josephson junction portions, and wherein said dc SQUID ring is disposed at the lowermost layer, said counter electrode is disposed at the uppermost layer and said modulation coil and said input coil are disposed at said at least one intermediate layer.

2. A dc SQUID element according to claim 1, wherein a surface of the SQUID ring comprises an area above which the modulation coil and input coil are not disposed, and at least a portion of the counter electrode is laminated on the surface of said area with a barrier layer therebetween.

3. A dc SQUID element comprising a SQUID ring, a counter electrode, a modulation coil and an input coil as formed by pattering respective superconducting thin films laminated on a substrate in a plurality of layers including a lowermost layer, at least one intermediate layer and an uppermost layer, said SQUID ring and said counter electrode being weak-linked at two portions thereof to each other by a bridge through a barrier layer to form two Josephson junction portions, and wherein said counter electrode is disposed at the lowermost layer, said SQUID ring is disposed at the uppermost layer and said modulation coil and said input coil are disposed at said at least one intermediate layer.

4. A dc SQUID element according to claim 3, wherein a surface of the counter electrode comprises an area above which the modulation coil and input coil are not disposed, and at least a portion of the SQUID ring is laminated on the surface of said area with a barrier layer therebetween.

* * * * *